(12) United States Patent
Uchida

(10) Patent No.: US 7,795,938 B2
(45) Date of Patent: Sep. 14, 2010

(54) APPARATUS AND METHOD FOR GENERATING CLOCK SIGNAL

(75) Inventor: Kohei Uchida, Tokyo (JP)

(73) Assignee: NEC Corporation, Tokyo (JP)

( * ) Notice: Subject to any disclaimer, the term of this patent is extended or adjusted under 35 U.S.C. 154(b) by 37 days.

(21) Appl. No.: 12/222,906

(22) Filed: Aug. 19, 2008

(65) Prior Publication Data
US 2009/0066383 A1    Mar. 12, 2009

(30) Foreign Application Priority Data
Sep. 11, 2007    (JP) .............................. 2007-236009

(51) Int. Cl.
*H03K 3/017* (2006.01)

(52) U.S. Cl. ....................................... 327/175; 327/172

(58) Field of Classification Search ........................ None
See application file for complete search history.

(56) References Cited

U.S. PATENT DOCUMENTS

| | | | |
|---|---|---|---|
| 7,233,186 B2 * | 6/2007 | Ishimi | 327/291 |
| 7,405,607 B2 * | 7/2008 | Ishimi | 327/291 |
| 7,411,413 B2 | 8/2008 | Shimazaki et al. | |
| 7,532,052 B2 * | 5/2009 | Nonaka | 327/175 |
| 2006/0273837 A1 | 12/2006 | Shimazaki et al. | |

FOREIGN PATENT DOCUMENTS

| | | |
|---|---|---|
| JP | 2006-339948 | 12/2006 |
| WO | 2004/038917 A1 | 5/2004 |

* cited by examiner

*Primary Examiner*—Cassandra Cox
(74) *Attorney, Agent, or Firm*—McGinn IP Law Group, PLLC

(57) ABSTRACT

An apparatus, including: a circuit which operates according to a clock signal, the circuit operating with a delay, and a clock generator which generates the clock signal with a duty ratio, the duty ratio being adapted to the delay.

10 Claims, 5 Drawing Sheets

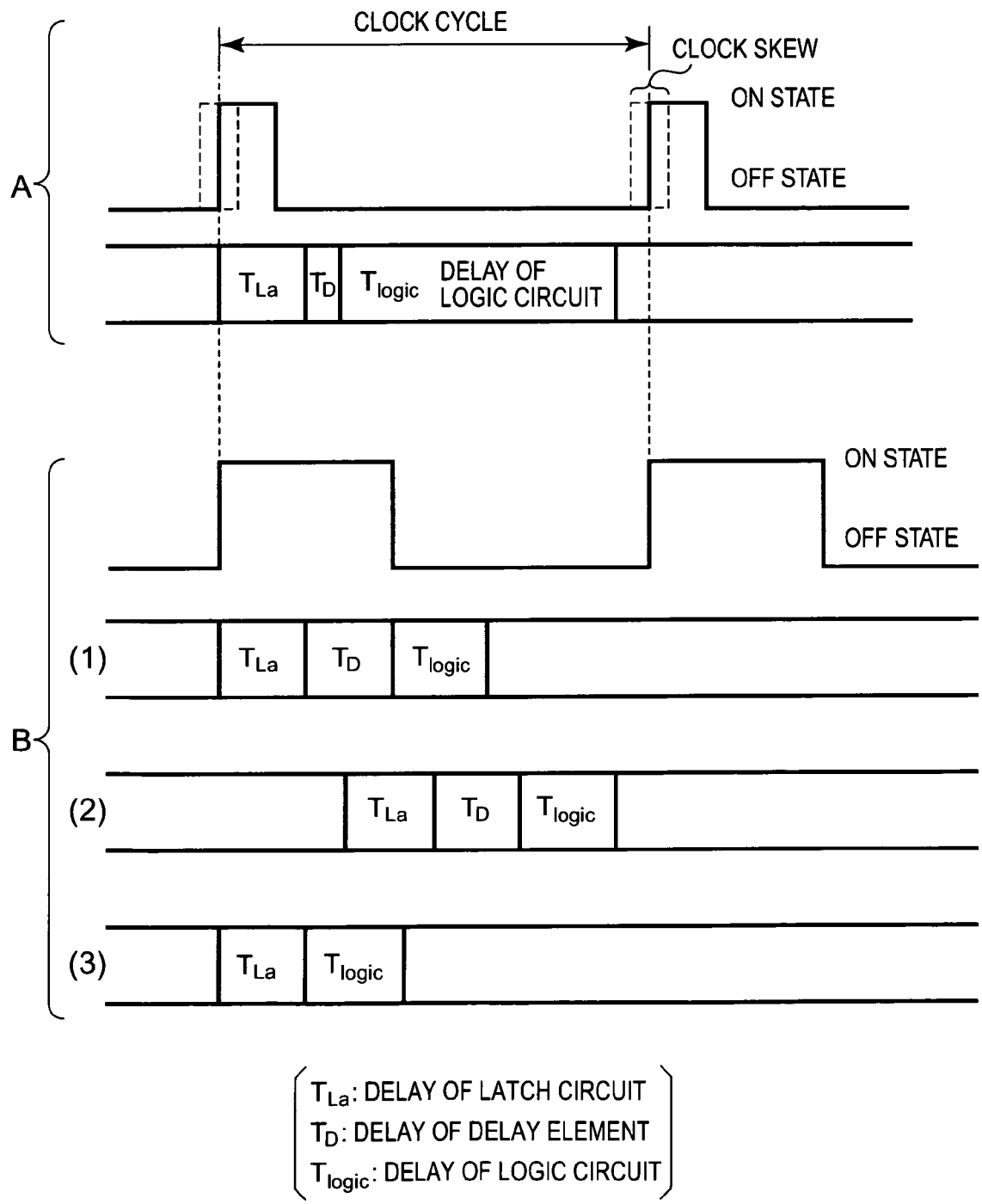

($t_1$: DELAY BY INVERTER CIRCUIT)

US 7,795,938 B2

APPARATUS AND METHOD FOR GENERATING CLOCK SIGNAL

INCORPORATION BY REFERENCE

This application is based upon and claims the benefit of priority from Japanese patent application No. 2007-236009, filed on Sep. 11, 2007, the disclosure of which is incorporated herein in its entirety by reference.

BACKGROUND OF THE INVENTION

1. Field of the Invention

The present invention relates to an apparatus including a semiconductor integrated circuit and the like, particularly a semiconductor integrated circuit including improved reliability and an improved manufacturing yield, and to a method for generating a clock signal to improve the reliability and the manufacturing yield.

2. Description of Related Art Recently, in a market, there is a demand that an LSI operates with higher frequency than ever and operates with lower power consumption than ever. For satisfying the demand, a pulse latch circuit is used in place of a flip flop (FF) which temporally stores a signal to be input/output to a logic circuit. By using the pulse latch circuit, the power consumption of the LSI becomes lower and an operation speed of the LSI becomes higher. Such a structure is disclosed in Patent document 1.

The pulse latch circuit outputs an input signal during when the clock signal is at high potential level ("H" level: "ON state"), and maintains the input signal during when the clock signal is at low potential level ("L" level: "Off state"). On the other hand, the flip flop maintains the input signal at a rising edge of the clock signal, or a falling edge of the clock signal.

It is common to use a pulse of the clock signal with a duty ratio of approximately 50%, because it is hardly influenced by factors of varying pulse width such as signal delay or jitter. However, for the pulse latch circuit, the pulse of the clock signal with a low duty ratio is used. By using the pulse with low duty ratio, the pulse of the clock signal for the pulse latch circuit may be with low duty ratio. By using the pulse with low duty ratio, a time usable for the logic circuit within a clock cycle of the clock signal may be increased. Therefore, by using the pulse with low duty ratio and the pulse latch circuit, the LSI can be operated with higher frequency rather than the flip flop circuit. Such a structure is disclosed in Patent document 2.

[Patent Document 1] Japanese Patent Laid-Open No. 2006-339948
[Patent Document 2] International Publication WO2004/038917 A1

SUMMARY OF THE INVENTION

According to one exemplary aspect of the present invention, an apparatus includes a circuit which operates according to a clock signal, the circuit operating with a delay, and a clock generator which generates the clock signal with a duty ratio, the duty ratio being adapted to the delay.

According to another exemplary aspect of the present invention, a method includes adapting a duty ratio of a clock signal for operating a circuit to a delay of the circuit, and operating the circuit according to the clock signal with the duty ratio adapted.

According to another exemplary aspect of the present invention, a method includes simulating a delay of a circuit operating according to a clock signal, and adapting a duty ratio of the clock signal to the delay.

BRIEF DESCRIPTION OF THE DRAWINGS

Other exemplary aspects and advantages of the invention will be made more apparent by the following detailed description and the accompanying drawings, wherein:

FIG. 2 shows an exemplary timing chart of the present invention;

DETAILED DESCRIPTION OF THE EXEMPLARY EMBODIMENT

When the pulse width of the clock signal is narrowed (i.e., when a duty ratio of the clock signal is decreased), the operation tends to be unstable, the reliability is lowered, and a yield of LSI manufacturing also tends to be reduced.

By an influence of a jitter, the pulse of the clock signal may be further narrowed and then may disappear. Due to unevenness of manufacturing of the LSI, the pulse width of the clock signal may easily fluctuate. Therefore, the reliability of the circuit operation and a yield of LSI manufacturing are decreased.

This is due to all the pulse widths of the clock signals having been determined so as to evenly match a logic circuit including the maximal delay time in an LSI regardless of the delay time of each logic circuit.

Figure 1:
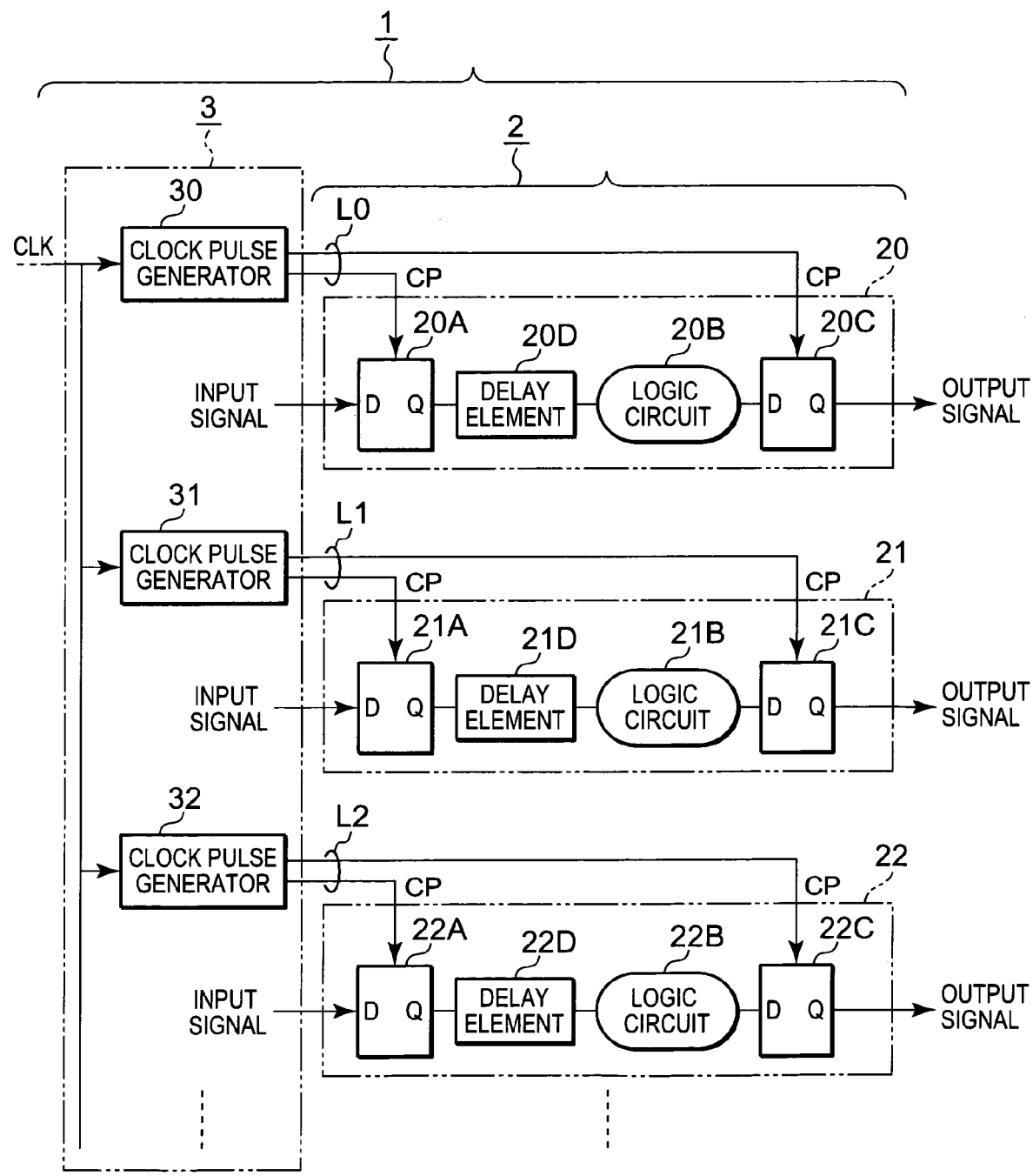
FIG. 1 shows an exemplary block diagram of an exemplary embodiment of the present invention.

In FIG. 1, the semiconductor integrated circuit 1 includes a logic operation section 2 including a plurality of logic-arithmetic circuits 20, 21, 22, and a clock distribution system 3 including a plurality of clock signal generators 30, 31, 32 each of which respectively sends clock signals into the corresponding one of the logic-arithmetic circuits 20, 21, 22. The number of the logic-arithmetic circuit and the clock signal generator may not be limited to the number shown exemplarily in FIG. 1.

The logic-arithmetic unit 20 includes a latch circuit 20A which operates as a memory element of an input signal, a logic circuit 20B which performs a logical operation according to the input signal input from the latch circuit 20A, and a latch circuit 20C which outputs a result of the logical operation of the logic circuit 20B.

The logic-arithmetic unit 20 includes a delay element 20D which compensates a minimum delay of the logic circuit 20B when a delay of the logic circuit 20B is small. The clock generator 30 receives a source clock signal (CLK), and then the clock generator 30 distributes the clock signal to the latch circuits 20A and 20C through a clock signal supply line L0.

Other logic-arithmetic circuits 21 and 22 also include latch circuits 21A and 22A which operate as memory elements of the input signal respectively, logic circuits 21B and 22B which perform logical operations based on the input signal input through respective latch circuits 21A and 22A, and latch circuits 21C, 22C which output a result of the logical operation of the logic circuits 21B and 22B, as with the case of the above described logic-arithmetic unit 20.

The logic-arithmetic units 21 and 22 include delay elements 21D and 22D which compensate a minimum delay of the logic circuit 21B and 22B when delays of the logic circuit 21B and 22B are small. The clock generators 31 and 32 receive the source clock signal (CLK), and then the clock generators 31 and 32 distribute the clock signal to the latch circuits 21A and 21C, 22A and 22C through a clock signal supply line L1 and L2, respectively.

The semiconductor integrated circuit (LSI) 1 according to the exemplary embodiment includes a feature of being configured so as to include the clock distribution system 2 provided with a plurality of the clock signal generators 30, 31, 32 which receive a clock signal distributed from a source clock signal (CLK), in which the clock signal generators 30, 31, 32 include various different duty ratios. In other words, the semiconductor integrated circuit (LSI) 1 makes a plurality of the clock signal generators generate clock signals including different duty ratios corresponding to the delay times specific to the logic circuits 20B, 21B, 22B, respectively, and uses the clock signals.

Next, an exemplary operation of the logic-arithmetic unit 20 in FIG. 1 will now be described with reference to a timing chart in FIG. 2.

The clock signal generator 30 generates a clock signal (CP) with a predetermined duty ratio on the basis of a source clock signal (CLK) from a clock source (not shown in FIG. 2), and supplies the clock signal (CP) to the latch circuit 20A through a clock signal line L0.

The latch circuit 20A outputs the input signal of the latch circuit 20A to an output terminal Q of the latch circuit 20A while the clock signal (CP) is in an ON state ("H" level). The output signal is delayed by the delay element 20D for providing the minimum delay, and enters into the logic circuit 20B. The logic circuit 20B processes the output signal. The output signal is delayed by a delay time of the logic circuit 20B, and is sent to an input terminal (D) of a next latch circuit 20C.

When the clock signal (CP) is in an OFF state ("L" level), the latch circuit 20C does not pass the signal through the circuit, so that the logic circuit 20B retains the input signal and waits until a clock signal (CP) turns into the ON state in the next clock cycle. In this way, circuits in the logic-arithmetic unit 20 are synchronously operated.

The latch circuit 20A outputs the input signal to the output terminal Q of the latch circuit 20A while the clock signal (CP) is in the ON state. However, when the pulse width of the clock signal (CP) is sufficiently narrow, the latch circuit 20A retains the input signal which is input to the latch circuit 20A when the clock signal (CP) is in the ON state, and outputs the input signal after the delay time ($T_{La}$ shown in FIG. 2) of the latch circuit 20A has been completed. The logic circuit 20B is allowed to include a period of time for processing the input signal from when the delay time ($T_{La}$) has been completed to a next rising edge of the clock signal (CP). It is shown in a timing chart A in FIG. 2.

An allowable delay period of time should be decided while additionally considering an influence of a clock skew.

When the pulse width of the clock signal (CP) is wide, the operation of the latch circuit 20A varies depending on whether the input signal changes or not while the clock signal is in the ON state. When the input signal does not change, the latch circuit 20A outputs the input signal captured by the latch circuit 20A at a timing of a rising edge of the clock signal. Therefore, the logic circuit 20B can timely (e.g., may afford to) process the input signal sent from the latch circuit 20A (i.e., the logic circuit 20B may obtain an affordable time for processing the input signal). In other words, a time from when the delay time ($T_{La}$) has been completed to a next rising edge of the clock signal (CP) is long enough to process the input signal. It is shown in a timing chart B(1) in FIG. 2.

When the input signal changes while the clock signal is in the ON state, the latch circuit 20A continues outputting the input signal as it is to an output terminal Q of the latch circuit 20A during when the clock signal (CP) is in the ON state. In this case, the latch circuit 20A may latch the input signal at a timing of a falling edge of the input signal, and may output the latched input signal to the output terminal Q. Therefore, the logic circuit 20B cannot (e.g., may not afford to) process the input signal sent from the latch circuit 20A (i.e., the logic circuit 20B may not obtain an affordable time for processing the input signal).

In other words, as shown in a timing chart B(2), since the delay time ($T_{La}$) of the latch circuit 20A shifts from a timing of the rising edge of the clock signal to a timing of the falling edge of the clock signal, a time from when the delay time ($T_{La}$) has been completed to a next rising edge of the clock signal (CP) may become shorter than that of the timing chart B(1). Therefore, the logic circuit 20B may not obtain an affordable time for processing the input signal.

On the other hand, when the pulse width of the clock signal is narrowed (i.e., when a duty ratio of the clock signal is decreased), the operation tends to be unstable, the reliability is lowered, and a yield of LSI manufacturing also tends to be reduced. In other words, by an influence of a jitter, the pulse of the clock signal may be further narrowed and then may disappear. Due to unevenness of manufacturing of the LSI, the pulse width of the clock signal may easily fluctuate. Therefore, the reliability of the circuit operation and a yield of LSI manufacturing are decreased.

In the exemplary embodiment of the present invention, when the delay of the logic circuit is large, the clock signal with a narrow pulse width (i.e., the clock signal with a low duty ratio) is used. The clock signal with a low duty ratio may include a longer "Off state" (i.e., the time period of a low level of the clock signal) in one clock cycle than the clock signal with a high duty ratio. When the clock signal with a low duty ratio is input to the latch circuit 20A, the latch circuit 20A retains the input signal and may not output the input signal to the logic circuit 20B while the clock signal has the "Off state". Therefore, the logic circuit 20B may be able to use the time period while the clock signal has the "Off state", for processing the input signal sent from the latch circuit 20A. In other words, using the clock signal with a low duty ratio may be suitable for the logic circuit 20B including a large delay.

On the other hand, when the delay of the logic circuit is small, the clock signal with a broad pulse width (i.e., the clock signal with a high duty ratio) is used.

As above described, in the exemplary embodiment, the pulse width of the clock signal may be adjustable according to the delay of the logic circuits.

In other words, in the exemplary embodiment, the pulse widths of the clock signals may not have been determined so as to evenly match the logic circuit with the maximal delay time in the LSI.

The delay element 20D may be unnecessary when the clock signal (CP) has a sufficiently small duty ratio (narrow pulse width), but may be necessary for preventing a "lacing" when the clock signal (CP) with a wide pulse width and the delay of the logic circuit 20B may be small.

Specifically, the latch circuit 20A is different from an FF circuit and directly transmits the input signal to the output terminal Q while the clock signal (CP) is in an ON state. Accordingly, when the delay of the logic circuit 20B installed behind (e.g., downstream) the latch circuit 20A may be small, the latch circuit 20A causes an inconvenience of transmitting the input signal to be transmitted to the logic circuit 20B originally in the next clock timing (see reference character B (3) in FIG. 2). This may be called "lacing". In order to prevent such inconvenience, the semiconductor integrated circuit may be provided with the delay element 20D for securing such a latest delay time as to correspond to the delay time and the clock signal width of the logic circuit 20B. In other words, the signal outputted from the latch circuit 20A may be intentionally delayed by the delay element 20D to prevent the lacing.

Herein below, specific examples and operation of the above described clock signal generator 30 will now be described with reference to FIG. 3.

Figure 3A:
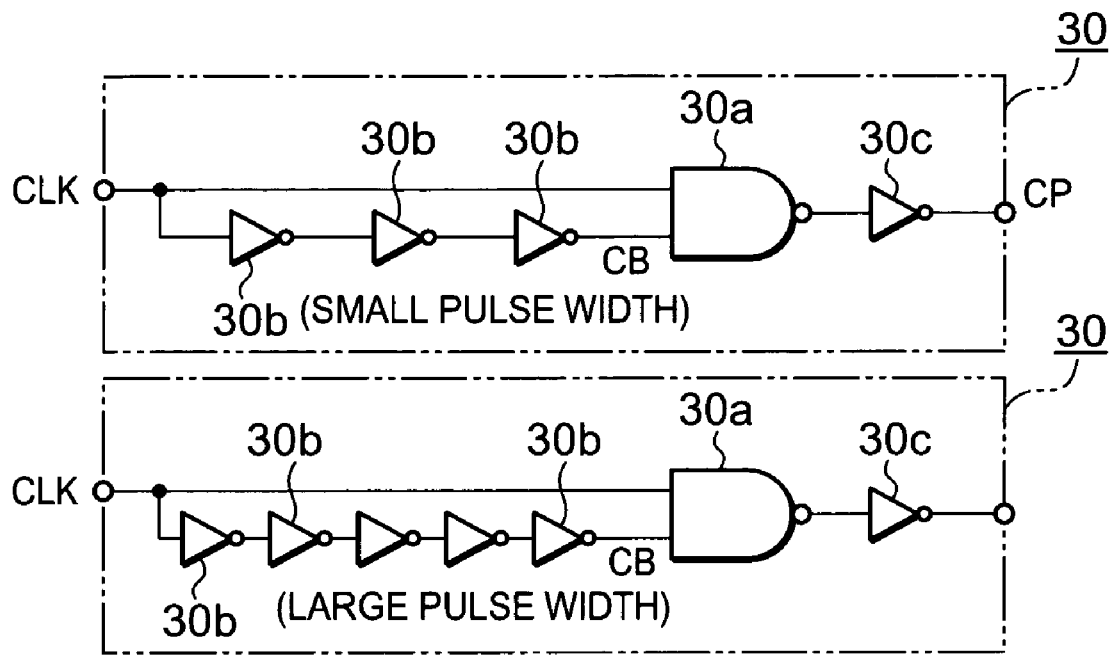
FIG. 3A shows an exemplary block diagram of a clock signal generator 30.

FIG. 3(A) illustrates two circuit examples as a specific example of a clock signal generator 30. As is clear from the examples, the clock signal generator 30 includes a configuration in which an odd number of inverter circuits 30b are serially connected to one terminal of two input terminals of a NAND circuit 30a, and at the same time, an inverter circuit 30c is connected to an output terminal of the NAND circuit 30a to form an AND circuit. In this case, the inverter circuit 30c includes a function of giving a delay time and (inversion of input signal) to the clock signal generator.

Figure 3B:
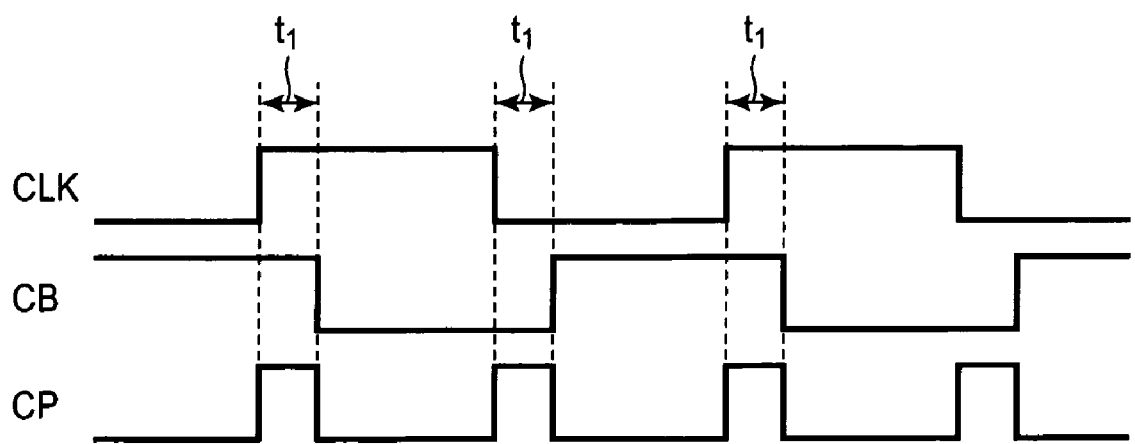
FIG. 3B shows an exemplary timing chart of the clock signal generator 30.

FIG. 3(B) illustrates an operation timing chart of the present clock signal generator. A chart shown in the upper stage is a source clock signal CLK including a duty ratio of about 50 [%], which has been distributed from a clock source of a clock distribution system 2. A chart in the middle stage shows a signal CB formed by delaying the source clock signal with an odd number of inverter circuits connected to each other and reversing the waveform. A chart shown in the lower stage is a signal output from an AND circuit of the two signals, that is, a waveform of the clock signal CP in the clock signal generator 30. The charts show that the pulse width of the clock signal CP is expanded (e.g., widened) because as the number of the stages of inverter circuits increases, the delay time increases.

The semiconductor integrated circuit according to the present embodiment is designed so as to improve the reliability of the operation and a manufacturing yield while keeping the operation at high speed, by using a plurality of clock signal generators which generate clock signals including such different pulse widths respectively.

In other words, the semiconductor integrated circuit 1 shown in the above described FIG. 1 is configured and operates as described above. Specifically, the circuit 1 expands the pulse width of the clock signal when driving a latch circuit that is attached to a logic circuit which shows (has) little delay and can afford to be operated slowly, while keeping the operation of the clock signal at high speed even in a latch circuit that is attached to a logic circuit which shows (has) much delay and cannot afford to be operated slowly. Accordingly, circuit 1 produces an effect of improving the reliability of the operation and a yield of manufacturing an LSI chip.

More specifically, the semiconductor integrated circuit 1 improves the reliability and the yield because of expanding the pulse width of the clock signal when the logic circuit 20B shows little delay and can afford to be operated slowly. The semiconductor integrated circuit 1 also produces an effect that it can keep the clock frequency high even in the logic circuit including a severe timing and consequently can be operated at high speed, because of keeping the pulse width at a narrowed state when the logic circuit 20B cannot afford to be delayed.

Thus, the logic-arithmetic unit 20 is configured and functions as described above, and other logic-arithmetic circuits 21, 22 and so on are also similarly configured to show a similar operation effect.

An optimized clock signal was described in a semiconductor integrated circuit 1 of the above-described FIG. 1.

Herein below, a method for optimizing the above-described clock signal will be described more in detail.

Figure 4A:
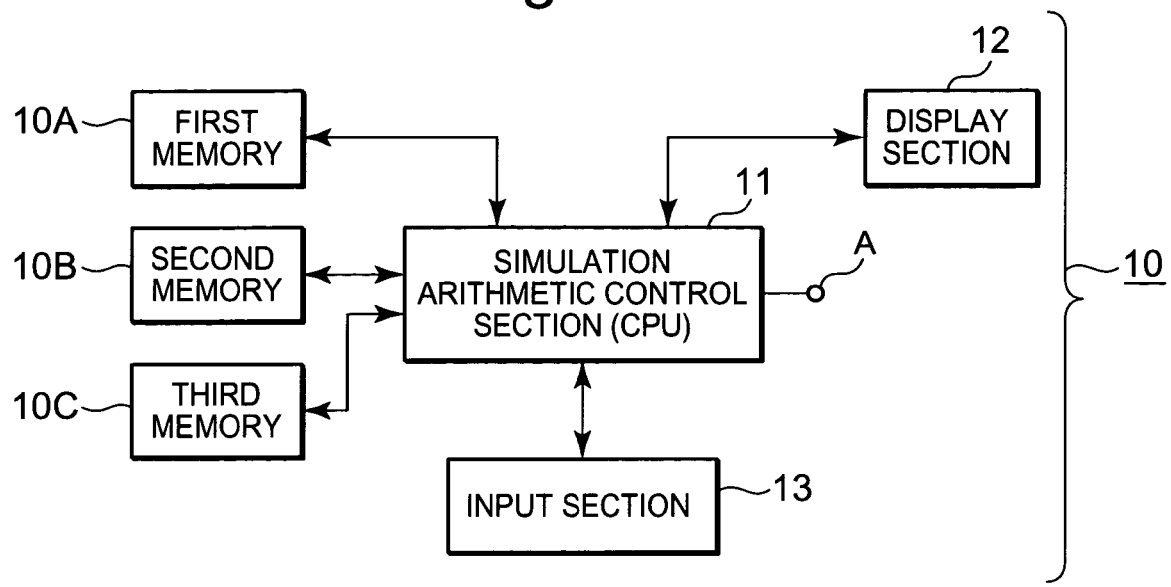
FIG. 4A shows an exemplary block diagram of another exemplary embodiment of the present invention.

As shown in FIG. 4A, circuit-simulating device 10 sets or structures each circuit in the semiconductor integrated circuit 1 which has been explained in the above described embodiment. In this case, the circuit-simulating device 10 will now be described while taking the above-described logic-arithmetic unit 20 as an example.

At first, as shown in FIG. 4(A), a circuit-simulating device 10 includes: a first memory 10A which previously (in advance) stores a library corresponding to a circuit element data forming a semiconductor integrated circuit 1; a second memory 10B which stores a circuit setting command program for configuring an objective circuit to be simulated on the basis of the stored library; a simulation arithmetic control section 11 which operates based on the circuit setting command program and structures the above described semiconductor integrated circuit 1; a display section 12 for displaying the information and result operated in (e.g., processed by) the simulation arithmetic control section 11 in real time; and a third memory 10C which stores contents displayed in the display section 12 according to a command from the outside.

The above described simulation arithmetic control section 11 includes a control function 11a for controlling the operation of each section in the system. Furthermore, as will be described below, the simulation arithmetic control section 11 includes a function 11b for setting an objective circuit to be simulated, a delay time calculation function 11c, a function 11d for judging the presence of delay allowance, and a function 11e for resetting a clock signal (pulse) generator.

Reference numeral 13 denotes an input unit for inputting various outside commands, new data, command information and the like into the above described simulation arithmetic control section 11. Reference numeral 11A denotes an information output terminal for outputting outside an operation result in the simulation arithmetic control section 11.

Below, a method for optimizing a clock signal according to the present embodiment first will be briefly described, and then will be described in detail afterwards.

A method for optimizing the clock signal according to the present embodiment includes repeating steps of: firstly inputting and setting an objective circuit to be simulated including a clock signal generator 30 onto a circuit-simulating device 10 provided with a library corresponding to circuit element data, on the basis of the library; calculating an operation delay by simulating the operation of the objective circuit; verifying a delay allowance by comparing the calculated value with a clock cycle; and replacing the clock signal generator 30 with another clock signal generator 30 including a wider pulse width, when a logic circuit includes sufficient delay time. Thereby, the optimizing method determines a clock signal generator 30 including the optimum pulse width.

This is remarkably different from a conventional method which includes evenly deciding the pulse width of the clock signal generator 30 regardless of the allowance for delay time.

Figure 4B:
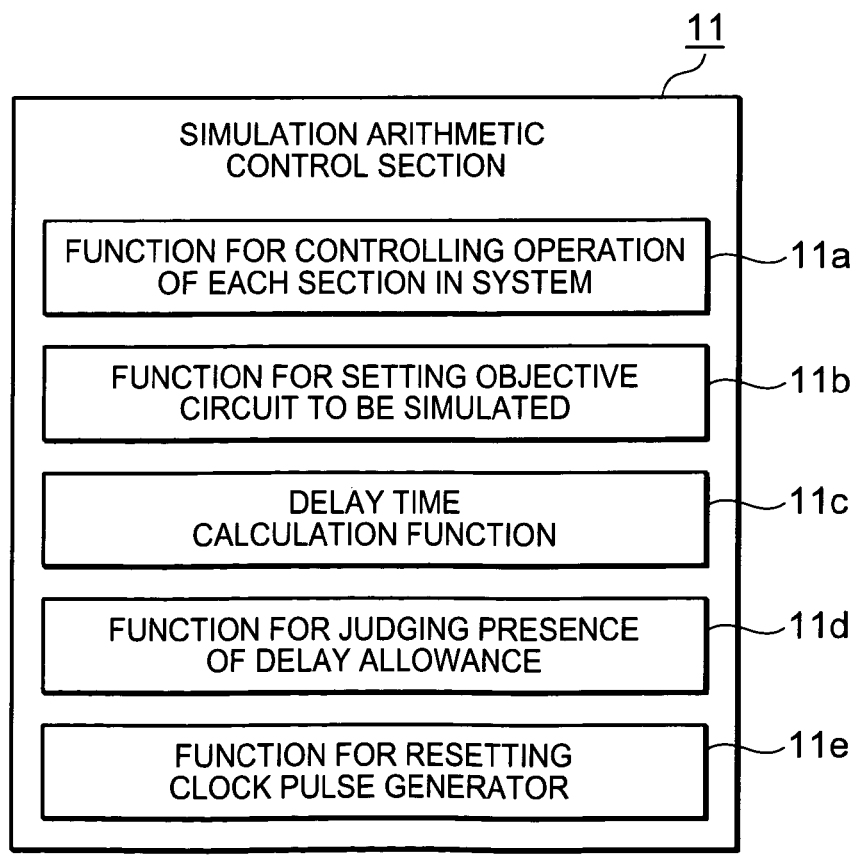
FIG. 4B shows an exemplary block diagram of a simulation arithmetic control section 11.
Figure 5:
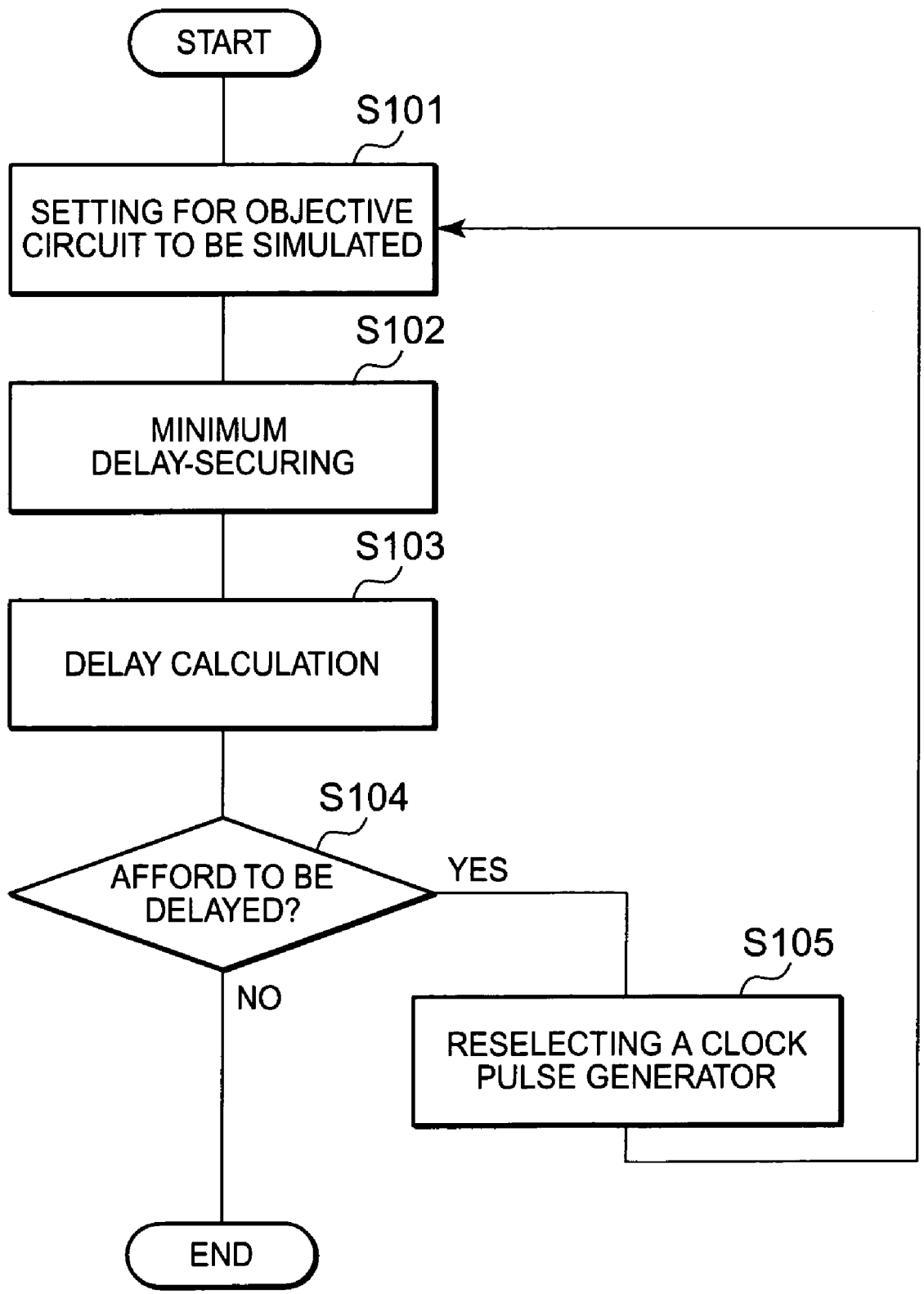
FIG. 5 shows an exemplary flow chart of the another exemplary embodiment of the present invention.

Herein below, the optimizing method will be described in more detail with reference to FIGS. 4-5

FIG. 4A illustrates a schematic structure of a circuit-simulating device 10 as described above, and FIG. 5 is a flow chart illustrating a method for optimizing a clock signal in a clock distribution system with the use of the circuit-simulating device 10 in FIG. 4A.

At first, a simulation arithmetic control section 11 (see FIG. 4B for more detail of section 11) of the circuit-simulating device 10 operates, and inputs and sets a circuit configuration of a semiconductor integrated circuit (LSI) 1 that is an object in which the clock signal is to be optimized on the circuit-simulating device 10 on the basis of the above described library (step S101, step for setting circuit). The step is carried out by a function 11b for setting an objective circuit to be simulated in the simulation arithmetic control section 11. In other words, the function 11b for setting the objective circuit inputs information on the semiconductor integrated circuit 1 which is an object for simulation. That is, inputted are each information on a logic circuit, a delay element for securing minimum delay, latch circuits installed in the front stage and the rear stage of the delay element and a clock signal generator for supplying a clock signal to the latch circuit, which are included in a clock distribution system, into the simulation arithmetic control section 11 from the above described library that is stored in each of the above described memories 10A and 10B (cf. FIG. 1).

Then, a clock signal generator is suitably selected as a clock signal generator 30 among plural types of clock signal generators 30 and so on illustrated in FIG. 3(A). Since the clock signal generator 30 will be reselected later by considering delay time of a logic circuit and the like, a clock signal generator 30 including the smallest pulse width may be selected or another clock signal generator 30 may be arbitrarily selected.

Next, the delay time of a delay element 20D which is inserted so as to give a delay time for securing (providing) the minimum delay according to the pulse width (step S102 of minimum delay-securing step) is given.

This step is performed so as to prevent lacing peculiar to a latch circuit. Lacing is a phenomenon that a signal to be transmitted to a rear stage originally in the next clock cycle is precedently transmitted to the logic circuit 20B, when a the clock signal includes a wide pulse width and the logic circuit 20B is delayed a little, and causes a malfunction. For this reason, specific delay time for securing the minimum delay depends on the pulse width.

Next, a delay time from a latch circuit 20A which is installed in a front stage and a rear stage of a logic circuit 20B to a latch circuit 20C is calculated by simulation (step S103, step for delay calculation). The delay time including the secured latest delay time is calculated by making a delay time calculation function 11c of the simulation arithmetic control section 11 simulate the operation of the logic circuit 20B when the logic circuit 20B is operated by using the selected initial clock signal generator 30.

Subsequently, the arithmetic control section 11 verifies whether the signal can afford to be delayed or not, by comparing the calculated value with the cycle time of a clock (step S104, delay allowance verification step), while considering an influence of a gap between clock timings (referred to as "clock skew") and the like. This step is carried out by a function 11d for judging the presence of a delay allowance in the simulation arithmetic control section 11.

When judged to afford to be delayed in the above described step (S104) of verifying delay allowance, the arithmetic control section selects a clock signal generator 30 including a wider pulse width from a library of clock signal generators 30, according to the delay allowance (step S105, step for resetting (reselecting) clock signal (pulse) generator). This step is carried out by a function 11e for resetting (reselecting) clock signal generator in the simulation arithmetic control section 11.

Thereafter, each of the above described steps of minimum delay-securing, delay time calculation, delay allowance verification and reselecting for a clock signal generator is iterated until there is no allowance of delay described above, based on the corrected circuit as a result of reselecting a clock signal generator 30.

With the above described structure and method, a selection and setting of a clock signal generator with respect to a circuit including one logic circuit (combinational logic circuit) and a latch circuit as a constitutional unit are completed. Thus, logic-arithmetic circuits 21, 22 and so on are sequentially assigned which include the logic circuit and the latch circuit as a constitutional unit, and the above described steps are iterated.

By the above operation, a pulse width (duty ratio of a clock signal) of a clock signal generator can be optimally determined so that the semiconductor integrated circuit (LSI) 1 which is an object to be designed, can be improved in its reliability and can be manufactured at an improved yield while maintaining a high-speed operation.

Here, as for each of the above described steps including a circuit setting step, a minimum delay-securing step, a delay calculation step, a step for judging the presence of delay allowance, and a step for reselecting clock signal generator, each of the processing contents may be programmed and configured so as to make a computer perform the program. In addition, when a computer system carries out such a program for optimizing a clock signal, the computer system needs to include a library including circuit element data of a clock signal generator, a latch circuit, a combinational logic circuit and the like previously stored in a memory device.

As described above, a method for optimizing a clock signal of LSI according to the present embodiment can optimally determine the clock signal generator including a plurality of pulse widths (duty ratio of a clock signal) for the LSI which is an object for the design, on the basis of on a delay time of the logic circuit, so that the present invention can provide a semiconductor integrated circuit (LSI) including improved operation reliability and a manufacturing yield while keeping the circuit operation at a high speed.

While the invention has been described in terms of several exemplary embodiments, those skilled in the art will recognize that the invention can be practiced with modification within the spirit and scope of the appended claims.

Further, it is noted that Applicant's intent is to encompass equivalents of all claim elements, even if amended later during prosecution.

What is claimed is:

1. An apparatus, comprising:
a circuit which operates according to a clock signal, said circuit operating with a delay; and
a clock generator which generates said clock signal with a duty ratio, said duty ratio being adapted to said delay, wherein said clock generator decreases said duty ratio when said delay increases.

2. An apparatus, comprising:
a circuit which operates according to a clock signal, said circuit operating with a delay; and
a clock generator which generates said clock signal with a duty ratio, said duty ratio being adapted to said delay, wherein said clock generator increases said duty ratio when said delay decreases.

3. An apparatus, comprising:
a circuit which operates according to a clock signal, said circuit operating with a delay; and
a clock generator which generates said clock signal with a duty ratio, said duty ratio being adapted to said delay,
wherein said clock generator adjusts said duty ratio so that said delay falls within a cycle of said clock signal.

4. An apparatus, comprising:
a circuit which operates according to a clock signal, said circuit operating with a delay; and
a clock generator which generates said clock signal with a duty ratio, said duty ratio being adapted to said delay;
wherein said circuit comprises:
a logic circuit; and
a latch circuit which temporally stores a signal to be input to said logic circuit, said latch circuit temporally storing said signal according to said clock signal,
wherein said clock generator generates said clock signal with said duty ratio, said duty ratio being adapted to said delay including a first delay corresponding to said logic circuit and a second delay corresponding to said latch circuit.

5. A method, comprising:
adapting a duty ratio of a clock signal for operating a circuit, to a delay of said circuit; and
operating said circuit according to said clock signal with said duty ratio adapted,
wherein said adapting said duty ratio comprises:
decreasing said duty ratio when said delay increases.

6. A method, comprising:
adapting a duty ratio of a clock signal for operating a circuit, to a delay of said circuit; and
operating said circuit according to said clock signal with said duty ratio adapted,
wherein said adapting said duty ratio comprises:
increasing said duty ratio when said delay decreases.

7. A method, comprising:
adapting a duty ratio of a clock signal for operating a circuit, to a delay of said circuit; and
operating said circuit according to said clock signal with said duty ratio adapted,
wherein said adapting said duty ratio comprises:
adjusting said duty ratio so that said delay falls within a cycle of said clock signal.

8. A method, comprising:
simulating a delay of a circuit operating according to a clock signal; and
adapting a duty ratio of said clock signal to said delay,
wherein said adapting said duty ratio comprises:
decreasing said duty ratio when said delay increases.

9. A method, comprising:
simulating a delay of a circuit operating according to a clock signal; and
adapting a duty ratio of said clock signal to said delay,
wherein said adapting said duty ratio comprises:
increasing said duty ratio when said delay decreases.

10. A method, comprising:
simulating a delay of a circuit operating according to a clock signal; and
adapting a duty ratio of said clock signal to said delay,
wherein said adapting said duty ratio comprises:
adjusting said duty ratio so that said delay falls within a cycle of said clock signal.

* * * * *